US008085160B2

(12) United States Patent
Vanderzon

(10) Patent No.: US 8,085,160 B2
(45) Date of Patent: Dec. 27, 2011

(54) LOAD DETECTOR FOR A DIMMER

(75) Inventor: James Robert Vanderzon, Bowden (AU)

(73) Assignee: Clipsal Australia Pty Ltd, Bowden (AU)

( * ) Notice: Subject to any disclaimer, the term of this patent is extended or adjusted under 35 U.S.C. 154(b) by 621 days.

(21) Appl. No.: 12/096,923

(22) PCT Filed: Dec. 12, 2006

(86) PCT No.: PCT/AU2006/001882
§ 371 (c)(1),
(2), (4) Date: Sep. 11, 2008

(87) PCT Pub. No.: WO2007/068041
PCT Pub. Date: Jun. 21, 2007

(65) Prior Publication Data
US 2009/0096625 A1    Apr. 16, 2009

(30) Foreign Application Priority Data

Dec. 12, 2005 (AU) ................. 2005906949
Dec. 12, 2005 (AU) ................. 2005906990

(51) Int. Cl.
G08B 21/00    (2006.01)
(52) U.S. Cl. ..... 340/661; 340/657; 324/414; 324/76.11; 315/307
(58) Field of Classification Search ................. 340/661, 340/660, 657; 324/414, 76.11, 654; 323/237, 323/246, 282; 315/291, 194, 307; 327/110, 327/139
See application file for complete search history.

(56) References Cited

U.S. PATENT DOCUMENTS

| 4,466,071 | A |   | 8/1984 | Russell, Jr. |
| 4,720,667 | A |   | 1/1988 | Lee et al. |
| 4,922,195 | A |   | 5/1990 | Cox |
| 5,239,255 | A | * | 8/1993 | Schanin et al. ............... 323/237 |
| 5,717,338 | A | * | 2/1998 | Cook ............................ 324/546 |
| 6,606,259 | B2 |   | 8/2003 | Cohen |
| 6,813,720 | B2 |   | 11/2004 | Leblanc |

FOREIGN PATENT DOCUMENTS

| CN | 1068237 | 1/1993 |
| DE | 102004028990 | 1/2005 |
| WO | 2006/023938 A2 | 3/2006 |

OTHER PUBLICATIONS

U.S. Appl. No. 12/096,916 to Vanderzon, which was filed Jun. 11, 2008.
U.S. Appl. No. 12/096,913 to Vanderzon, which was filed Jun. 11, 2008.

* cited by examiner

*Primary Examiner* — Jennifer Mehmood
*Assistant Examiner* — Hongmin Fan
(74) *Attorney, Agent, or Firm* — Greenblum & Bernstein, P.L.C.

(57) ABSTRACT

Disclosed is a circuit for detecting the presence of an inductive load. The circuit uses a voltage ringing detector to detect a voltage ringing signal across the inductive load and a signal generator for generating a signal indicating the presence of the inductive load upon detection of the ringing signal. The circuit may be used in a dimmer circuit for controlling the load. The circuit may be used as a load detector for a universal dimmer or may be used in a protection circuit for circuits not designed to control inductive loads.

27 Claims, 5 Drawing Sheets

LOAD DETECTOR FOR A DIMMER

TECHNICAL FIELD

This invention relates to load detection circuits and in particular, but not limited to, for use in dimmer circuits.

PRIORITY

This specification claims priority from:

Australian Provisional Patent Application No. 2005906990 entitled "A Universal Dimmer" and filed on 12 Dec. 2005; and Australian Provisional Patent Application No. 2005906949 entitled "Load detector for a Dimmer" and filed on 12 Dec. 2005.

The entire content of each of these applications is hereby incorporated by reference.

BACKGROUND

Dimmer circuits are used to control the power provided to a load such as a light or electric motor from an alternating current (AC) power source such as mains. Such circuits often use a technique referred to as phase controlled dimming. This allows power provided to the load to be controlled by varying the amount of time that a switch connecting the load to the power source is conducting during a given cycle.

For example, if voltage provided by the power source can be represented by a sine wave, then maximum power is provided to the load if the switch connecting the load to the power source is on at all times. In this way the, the total energy of the power source is transferred to the load. If the switch is turned off for a portion of each cycle (both positive and negative), then a proportional amount of the sine wave is effectively isolated from the load, thus reducing the average energy provided to the load. For example, if the switch is turned on and off half way through each cycle, then only half of the power will be transferred to the load. Because these types of circuits are often used with resistive loads and not inductive loads, the effect of repeatedly switching on and off power will not be noticeable as the resistive load has an inherent inertia to it. The overall effect will be, for example in the case of a light, a smooth dimming action resulting in the control of the luminosity of the light. This technique will be well understood by the person skilled in the art.

Modern dimming circuits generally operate in one of two ways—leading edge or trailing edge.

In leading edge technology, the dimmer circuit "chops out" or blocks conduction of electricity by the load in the front part of each half cycle (hence the term "leading edge").

In trailing edge technology, the dimmer circuit "chops out" or blocks conduction of electricity by the load in the back part of each half cycle.

FIG. 1A shows a representation of the function of a leading edge dimmer, while FIG. 1B shows the function of a trailing edge circuit.

In FIG. 1A, the shaded region of the sine wave, representing the applied AC power to the load, indicates the part of the cycle during which the dimmer circuit allows electricity to reach the load. The blank region in front of the shaded region indicates the part of the cycle that has been blocked by the dimmer circuit, preventing power from being applied to the dimmer circuit.

In FIG. 1B, the reverse situation, for the trailing edge, is illustrated. In this case, the shaded region at the beginning of the AC cycle indicates the part of the cycle during which the dimmer circuit allows electricity to reach the load. The blank region after the shaded region indicates the part of the cycle that has been blocked by the dimmer circuit, preventing power from being applied to the dimmer circuit.

Which of the two technologies used for a particular application depends upon the type of the load. Inductive load types (such as iron core low voltage lighting transformers and small fan motors) are best suited to leading edge operating mode, where the established half-cycle load current is terminated when at substantially low levels, thus avoiding undesirable voltage spiking. Capacitive load types are best suited to trailing edge operating mode, where the start-of-half-cycle applied load voltage ramps up from zero at a relatively slow rate, thus avoiding undesirable current spiking.

In practice, it has been necessary to select the appropriate dimmer for the appropriate load. This requires stocking multiples of each type of dimmer and has the risk that the incorrect dimmer is connected to a given load.

An improved form of dimmer circuit, known as "adaptive" or "universal" dimmers has been developed, which can function in either the leading edge or trailing edge mode. This alleviates the need to have multiples of each dimmer type to cater for different loads, and the installer does not have to be particularly concerned about the load type. Additionally, from the manufacturing standpoint, only one build type of dimmer is required.

Universal dimmer designs incorporate a means to initially determine which operating mode is suitable for the connected load, in addition to non-volatile memory elements for the purpose of retaining the operating mode thereafter.

In many existing devices, the load detection process and resultant mode changeover (if necessary), often results in lamp load flickering which can be undesirable in lighting installations.

It is an object of the present invention to provide a circuit that is able to detect the presence of an inductive load.

SUMMARY

According to a first aspect of the present invention, there is provided a circuit for detecting the presence of an inductive load, the circuit comprising:
 a voltage ringing detector for detecting a voltage ringing signal across the inductive load; and
 a signal generator for generating a signal indicating the presence of an inductive load upon the voltage ringing detector detecting said voltage ringing signal.

In one form, the voltage ringing detector comprises a peak detector for detecting a peak value of the voltage ringing signal and for generating a dc signal corresponding to the detected peak value.

In one form, the circuit further comprises a dc accumulator for accumulating the dc signal over time to provide an accumulated dc signal.

In another form, the circuit further comprises a comparator for comparing the accumulated dc signal with a reference voltage and producing an output when the accumulated dc signal exceeds the reference voltage.

In a further form, the circuit further comprises an inductive load indicator for generating a signal indicating the presence of the inductive load when the output of the comparator indicates the accumulated dc signal exceeds the reference voltage.

In one form, the circuit further comprises a voltage spike detector for detecting the presence of a voltage spike across the load and for generating a signal indicating the presence of the voltage spike.

In one form, the circuit further includes a signal generator to generate a signal to a mode changing circuit for changing a mode of operation of a dimmer circuit from trailing edge to leading edge operation upon detection of the voltage ringing signal.

In another form, the circuit further includes a signal generator to generate a signal to a mode changing circuit for changing a mode of operation of a dimmer circuit from trailing edge to leading edge operation upon detection of the voltage spike.

According to another aspect of the present invention, there is provided a dimmer circuit comprising the circuit of the first aspect of the present invention.

In one form, the dimmer circuit is a trailing edge dimmer circuit.

According to a further aspect of the present invention, there is provided a universal dimmer circuit comprising the circuit according to the first aspect of the present invention.

According to yet another aspect of the present invention, there is provided a method for detecting the presence of an inductive load, the method comprising:

detecting a voltage ringing signal across the load; and
  generating a signal indicating the presence of an inductive load upon detecting said voltage ringing signal.

In one form, the method further comprises detecting a peak value of the voltage ringing signal and generating a dc signal corresponding to the detected peak value.

In one form, the method further comprises only detecting the peak value of the voltage ringing signal during a brief period at each half cycle of the voltage signal applied to the load so as to minimise the effect of electrical noise.

In another form, the method further comprises accumulating the dc signal over time to provide an accumulated dc signal.

In one form, the method further comprises comparing the accumulated dc signal with a reference voltage and producing an output when the accumulated dc signal exceeds the reference voltage.

In one form, the method further comprises generating a signal indicating the presence of the inductive load when the accumulated dc signal exceeds the reference voltage.

In one form, the method further comprises detecting the presence of a voltage spike across the load and generating a signal indicating the presence of the voltage spike.

In one form, the method further comprises generating a signal to change a mode of operation of a dimmer circuit from trailing edge to leading edge operation upon detection of the voltage ringing signal.

In another form, the method further comprises generating a signal to change a mode of operation of a dimmer circuit from trailing edge to leading edge operation upon detection of the voltage spike.

According to a yet further aspect of the present invention, there is provided a voltage ringing detector for detecting a voltage ringing signal across an inductive load, the voltage ringing detector comprising:

a peak detector for detecting a peak value of the voltage ringing signal and for generating a dc signal corresponding to the detected peak value.

According to yet another aspect of the present invention, there is provided a method of detecting a voltage ringing signal across an inductive load, the method comprising:

detecting a peak value of the voltage ringing signal and generating a dc signal corresponding to the detected peak value.

BRIEF DESCRIPTION OF THE DRAWINGS

The invention will now be described in more detail with reference to the following drawings in which.

DETAILED DESCRIPTION

According to an aspect of the present invention, the universal dimmer of the present invention employs a method which selects the appropriate dimmer operating mode each time the lamp load is activated. Consequently, at load switch off, the operating mode does not require to be retained for the next load operation.

According to another aspect of the invention, one method of load type detection involves the detection of the presence of dimmer voltage ringing in response to a connected inductive load. Standard construction low voltage lighting transformers exhibit sufficient "leakage inductance" to produce the required dimmer voltage ringing behavior. Detection of dimmer voltage ringing while initially at low trailing edge mode conduction angles allows changeover to leading edge mode to occur while the lamp is at relatively low brightness levels—where any step change in effective applied load power is not noticeable (a lighting transformer driven in trailing edge mode will produce a higher output power level than when driven in leading edge mode—for the same dimmer conduction angle setting. This difference is greater at higher conduction angles).

According to yet another aspect of the present invention, a secondary method of load type detection, acting in tandem to the principal method described above, allows for highly inductive loads such as fan motors to also be readily detected, with resultant changeover to leading edge mode. For this method of detection, the trailing edge dimmer voltage spiking resulting from the highly inductive load is clamped to safe acceptable levels, whilst being monitored to instigate changeover to leading edge mode. In a similar fashion to that described above, detection of dimmer voltage spiking while initially at low trailing edge mode conduction angles allows changeover to leading edge mode to occur while the motor is at relatively low conduction angles ie. before the motor even begins to spin.

Only the relevant circuit sections for providing the discussed additional function of automatic detection of connected inductive loads will be described. Circuitry pertaining to the derivation of the necessary drive control signals suitable for implementation of either reverse or forward phase control mode of dimmer operation is omitted, as this may be standard circuitry in current universal dimmers and will be well known to the person skilled in the art.

It is assumed that such a control circuit initially operates in reverse phase, or trailing edge control mode, but is capable of being triggered into forward phase control when necessary.

Figure 1A:
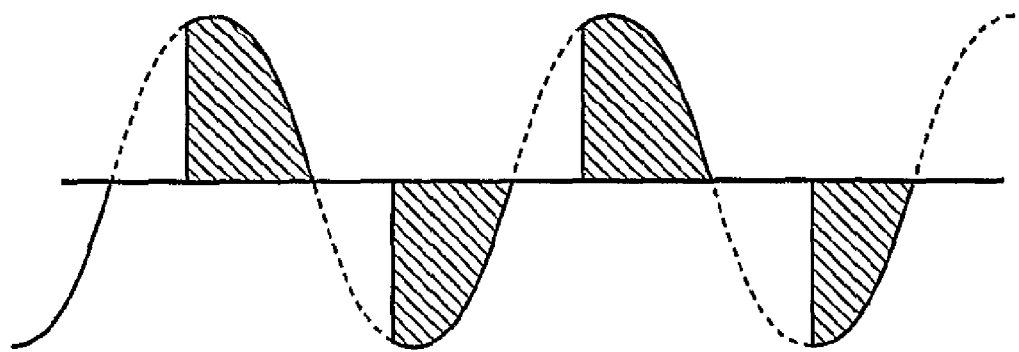
FIG. 1A shows a representation of leading edge dimmer operation.
Figure 1B:
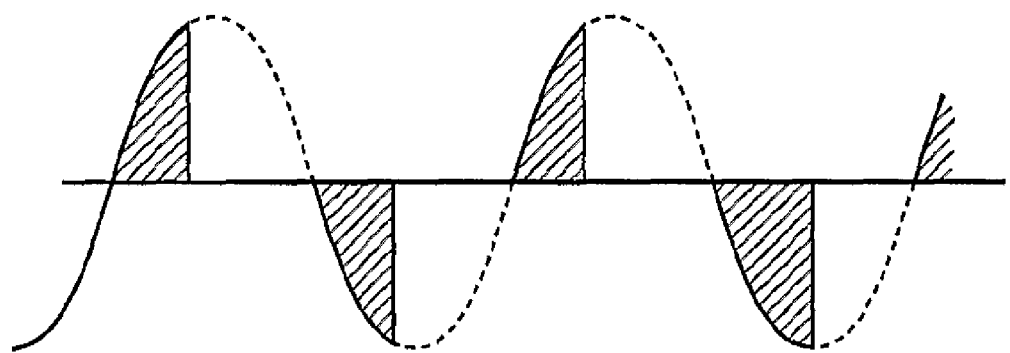
FIG. 1B shows a representation of trailing edge dimmer operation.
Figure 2:
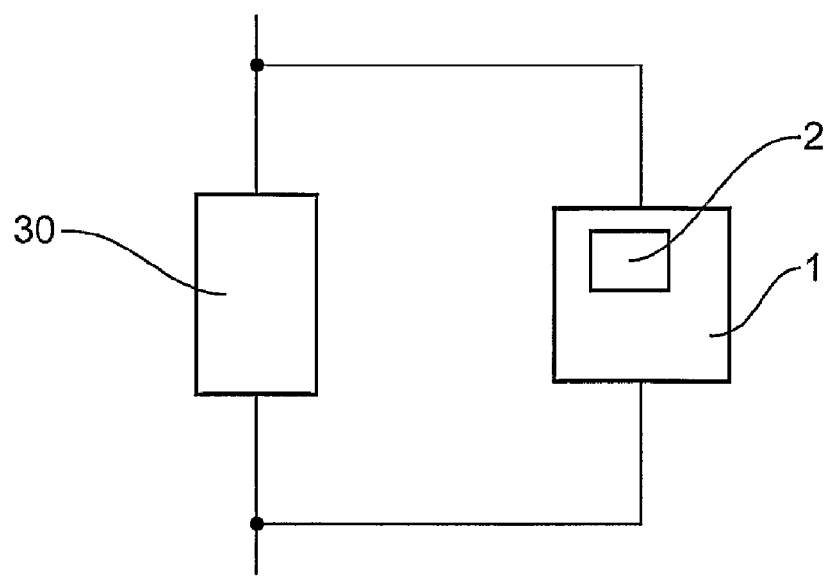
FIG. 2—shows a universal dimmer according to an aspect of the present invention in which the load type is detected upon each activation of the universal dimmer circuit.

Referring now to FIG. 2, there is shown a universal dimmer 1 connected to and controlling power applied to load 30. Inside universal dimmer 1 is a load type detector 2, which according to one aspect of the invention, detects the type of the load 30 upon each activation of the universal dimmer 1.

Figure 3:
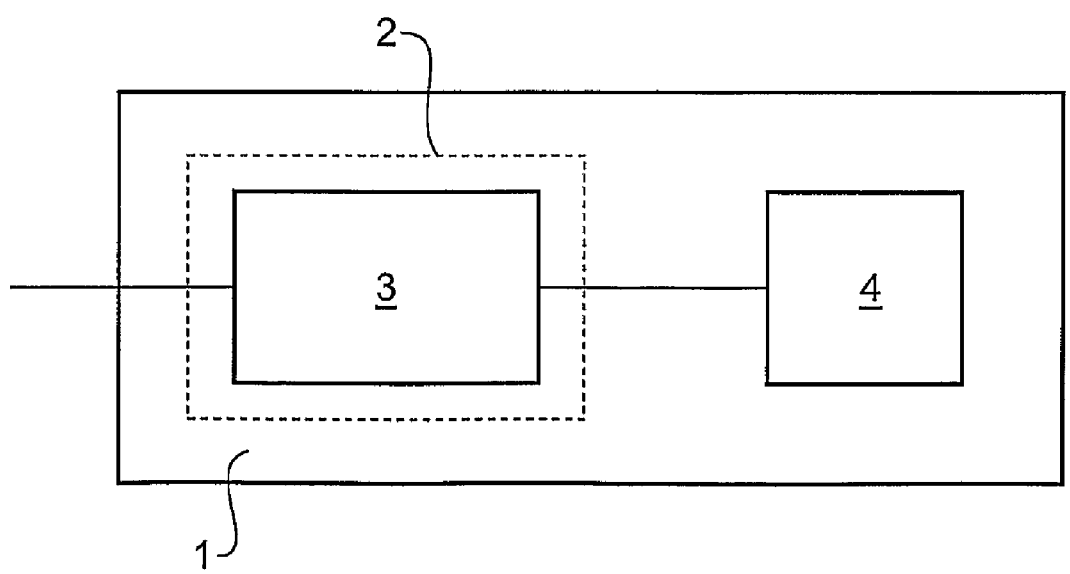
FIG. 3—shows a universal dimmer circuit according to another aspect of the present invention, in which the load type is detected using an inductive load detector.

In one specific form of the invention, load type detector 2 is provided by an inductive load detector 3, as shown in FIG. 3. In this aspect, universal dimmer 1 also has a mode control circuit 4, for changing the mode of operation of universal dimmer 1. In this aspect, universal dimmer 1 begins its operation in the trailing edge mode, and upon detection of an inductive load by inductive load detector 3, which then generates a signal to mode control circuit 4, mode control circuit 4 changes the operating mode of universal dimmer 1 from trailing edge to leading edge, as is known to the person skilled in the art.

Figure 4:
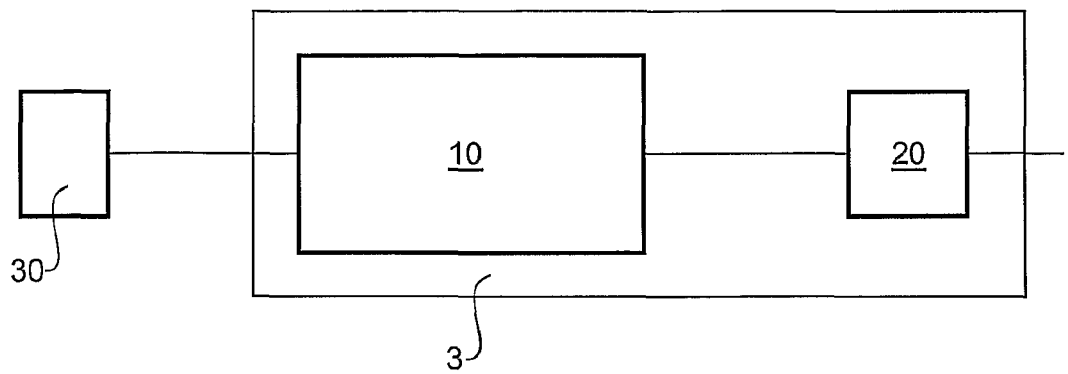
FIG. 4—shows a block diagram showing the use of a ringing detector in an aspect of the present invention.

Referring now to FIG. 4, there is shown a block diagram of one specific form of inductive load detector 3. Shown there is ringing detector 10, which receives as an input, a measure of the load voltage appearing across the load 30. If load 30 is an inductive load, the use of trailing edge dimming will result in a voltage ringing signal induced across the load. Upon detection of this voltage ringing signal, ringing detector 10 will generate a signal indicating the presence of an inductive load.

When used in a universal dimmer, this signal can be applied to known circuitry (not shown) to change the mode of operation of the universal dimmer from trailing edge to leading edge as will be understood by the person skilled in the art.

Indeed, if the ringing circuit is used in another type of device that is required to detect ringing or to detect a load type, then this signal could be used as required by that device. For example, if the device is a non-universal dimmer and can only operate in the trailing edge mode, then this signal may be used as a shutdown or other warning signal to prevent damage to the device and surrounding equipment.

In this particular embodiment, the indicating signal is provided to the mode control circuitry via a latch 20.

To facilitate understanding of the function of the arrangement discussed above and further below, reference will now be made to FIGS. 5, 6A and 6B, which show waveforms of signals at various points in the arrangement.

Figure 5:
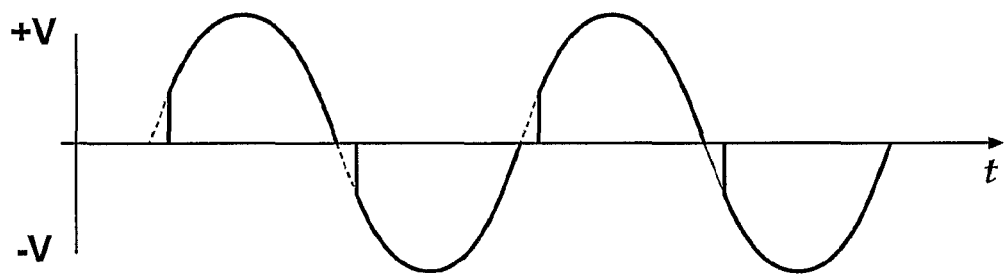
FIG. 5—shows a voltage waveform across the dimmer controlling a resistive load.

FIG. 5 depicts the voltage across the dimmer at start-up at low conduction angle in trailing edge mode, when connected to a resistive load 30. As can be seen, at the end of each half-cycle conduction period, the dimmer voltage rises from near zero volts to instantaneous line voltage.

Figure 6A:
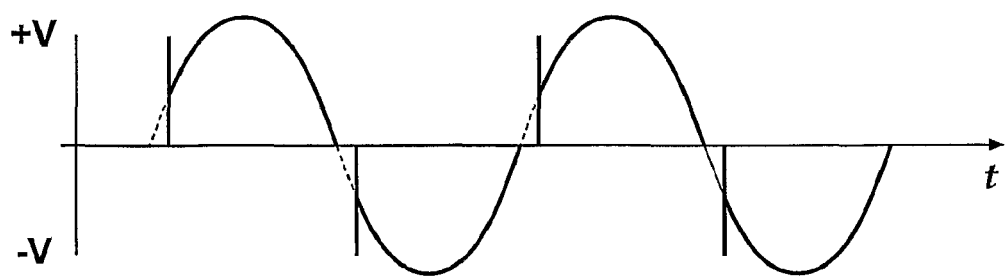
FIG. 6A—shows a voltage waveform across a dimmer controlling an inductive load.

FIG. 6A now depicts the voltage across the dimmer at start-up at low conduction angle in trailing edge mode, when the dimmer 1 is connected to an inductive load. In this case, at end of the half-cycle conduction period, the dimmer voltage rises from near zero volts to momentarily exceed the instantaneous line voltage.

Figure 6B:
FIG. 6B—shows an expanded version of the waveform of FIG. 6A.

FIG. 6B shows an expanded waveform of FIG. 6A, depicting voltage across the dimmer 1 at start-up at low conduction angle, when connected to an inductive load.

The voltage oscillation or ringing occurs at a frequency significantly greater than the line voltage frequency, as will be discussed further below, with ringing amplitude Vpk.

Figure 7:
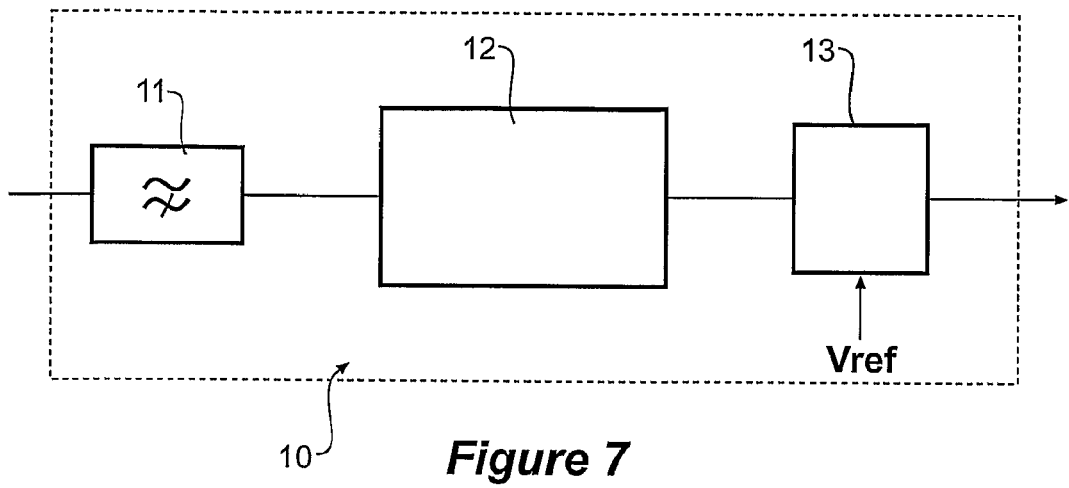
FIG. 7—shows a block diagram showing the main components of the ringing detector of FIG. 4.

Turning now to FIG. 7, there is shown the main elements of ringing detector 10. At the input of ringing detector 10 is a filter 11 for extracting the high frequency component described above with reference to FIG. 6B. This signal component is generally about 1 kHz ringing signal from the mains ac voltage (typically 50 Hz-60 Hz depending upon the country and application) applied to the load.

This extracted signal is then applied to peak detector 12, which detects the peaks in the ringing signal. The detection of these peaks then produces a signal which is input to comparator 13. A reference voltage is also applied to a second input of comparator 13. When the level of the output signal from peak detector 12 exceeds the reference voltage, comparator 13 will generate a signal indicating the presence of ringing, which in turn indicates that load 30 is an inductive load.

Figure 8:
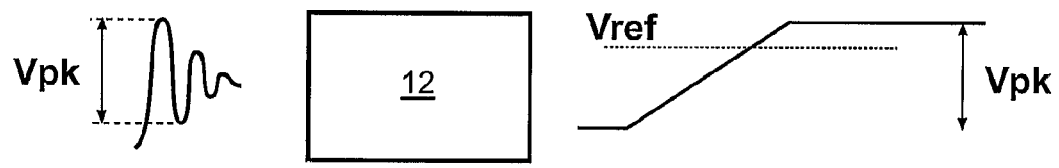
FIG. 8—shows the waveforms of the input and output of the peak detector of FIG. 7.

FIG. 8 shows the output waveform from filter 11 shown in FIG. 7, which is a high pass filter to reject line voltage frequency component, thus only the ringing waveform component of amplitude Vpk appears at the input to the peak detector 12.

The peak detector has an effective response time equal to several cycles of line voltage period, therefore the peak output voltage is achieved only after a corresponding number of consecutive ringing waveform events have occurred.

When the magnitude of the peak detector output exceeds the associated reference voltage, the following comparator activates a latch circuit to change the dimmer operation to leading edge mode. FIG. 8 shows the waveform of the output of the peak detector rising to a value of Vpk. FIG. 8 also shows the value of Vref in dotted lines for reference.

When the dimmer operation changes to leading edge mode the peak detector output slowly falls to zero, due to relatively slow decay time constant.

It will be understood that when this arrangement is used in a universal dimming circuit, this output may be used to trigger a known mode control circuitry to change the mode of operation of the universal dimming circuit from trailing edge to leading edge as described above.

Figure 9:
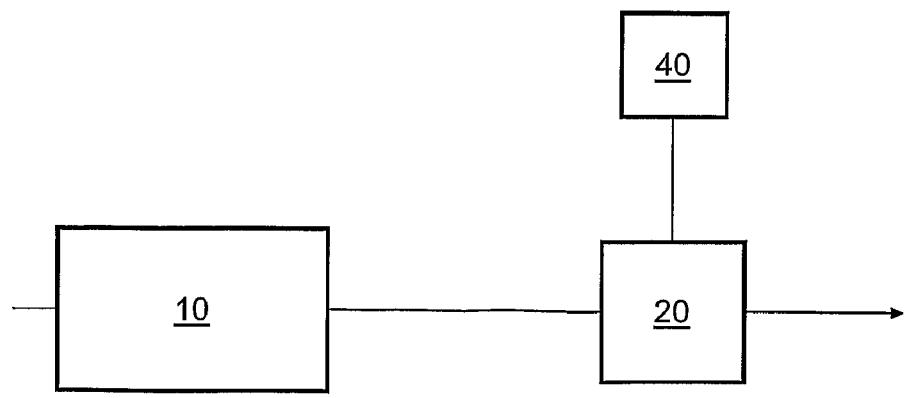
FIG. 9—shows a block diagram showing the use of a voltage spike detector in an aspect of the present invention.

FIG. 9 shows FIG. 4 with an additional spike detector 40. Spike detector 40 may be used in conjunction with ringing detector 10 to further enhance the performance of the arrangement of the present invention.

Figure 10:
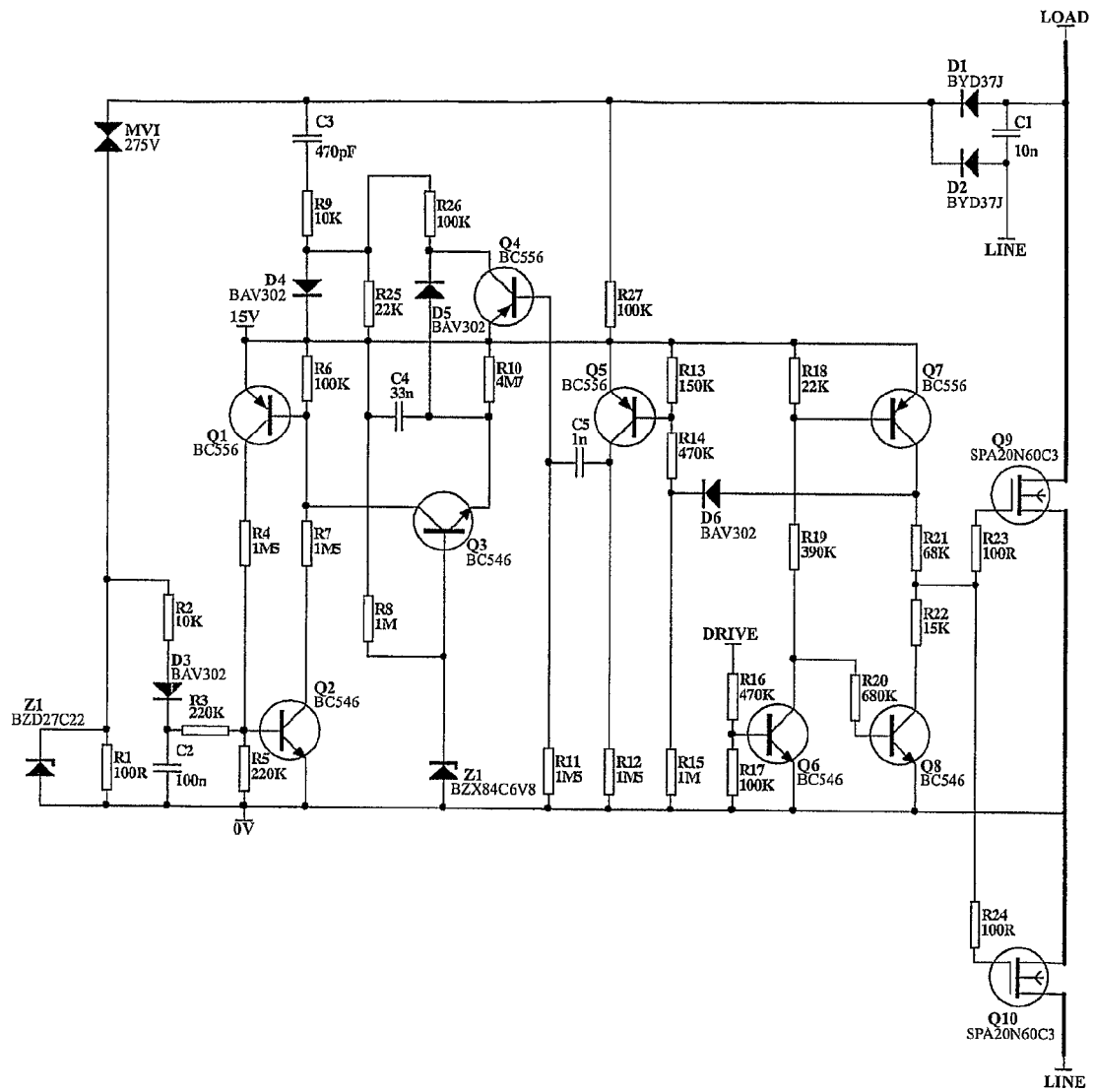
FIG. 10—shows a circuit diagram of one form of the present invention.

The circuit and the operation of the preferred embodiment of the present invention will now be described in detail with reference to FIG. 10.

The circuit of the present invention can be divided into several functional blocks as follows:

Power Transistor Drive Circuit

The load conducting elements in a typical reverse phase control dimmer comprise a pair of transistors such as MOSFET devices. Suitable gate input drive circuitry is required to provide control of switching transition time, as a means of limiting EMI (Electromagnetic Interference) emission levels (strict Standards apply in the industry to limit the level of EMI coming from devices such as dimmers).

Transistors Q9 & Q10 as seen in FIG. 5 connect in series back-to-back fashion to form an ac switch for control of the connected load. In this embodiment, transistors Q9 and Q10 are MOSFETs (Metal-Oxide Semiconductor Field Effect Transistors), often used in power control applications. Resistors R23 & R24 assist in preventing parasitic oscillation that can occur with parallel connected MOSFETs.

Application of drive voltage to resistor R16 results in conduction of transistor Q6, which simultaneously causes transistor Q8 to be cutoff and transistor Q7 to also conduct and therefore result in activation of the load controlling ac switch.

The values of resistors R18, R19 & R20 are selected to ensure that Q7 conduction status follows that of Q6, while Q8 assumes the opposite conduction status. Q7 provides a level shifting function, while Q8 provides an inversion function.

Resistor R21 limits turn-on current via Q7 to ac switch gate input, necessary to achieve controlled leading edge switching transition times, particularly when the dimmer operation is in the forward phase or leading edge control mode.

Resistor R22 limits turn-off current via Q8 from ac switch gate input, necessary to achieve controlled trailing edge switching transition times, particularly when dimmer operation is in reverse phase control mode.

Level shifting transistor Q5, with bias resistors R13, R14 & R15 and blocking diode D6, is arranged to have conduction status opposite to that of Q6. This transistor provides an inverted pull-up drive for momentary enabling of the ringing detector circuit, which is described in more detail below.

Ringing Detector Circuit

Capacitor C1 determines, in part, the ringing signal amplitude and frequency at each mains half-cycle dimmer turn-off transition. Diodes D1 & D2, in conjunction with intrinsic inverse diodes associated with Q9 & Q10, form a diode bridge to provide full-wave rectification of dimmer voltage waveform. At each mains half-cycle turn-off transition an initially rising voltage, followed by a ringing voltage component, centered around the instantaneous mains voltage, appears at the dc side of the bridge.

At the rising dimmer voltage transition, input coupling capacitor C3 becomes charged, via series components resistor R9, diode D4 & 15V dc rail, to a level equal to the peak ringing voltage.

During the first ringing cycle, where the voltage is then falling, diode D4 becomes reverse biased while D5 is forward biased. This allows partial charge storage transfer from C3, via resistors R9, R26 & diode D5, into detector output capacitor C4—which consequently develops a negative voltage with respect to the 15V rail.

The charge delivered to detector output capacitor C4 accumulates with each mains half-cycle ringing event, with corresponding increase in capacitor voltage. Filter input resistor R26 provides a high frequency "noise" rejection function. Resistor R27 represents loading on the dc side of the diode bridge circuit, necessary to ensure the bridge output voltage can fall at a similar rate to that of the dimmer terminal voltage. Such loading elements can be provided by current source elements for 15V rail.

Detector discharge resistor R10 has sufficient value that the rate of discharge of detector output capacitor C4 is relatively slow compared to the charging pulse repetition rate.

Diode D5 prevents discharge of detector output capacitor C4 during the rising dimmer voltage transitions. This is necessary for the "detection" function.

Resistor R25 in conjunction with input coupling capacitor C3, provides a high-pass-filter function to prevent the relatively slow falling rate of change of mains instantaneous voltage from contributing to the detector output voltage. This provides the function of block 11 in FIG. 7.

The comparator circuit 13 (see FIG. 7) comprises bias current resistor R8, reference zener diode Z2 and transistor Q3. The emitter terminal of Q3 forms the comparator input, while the collector terminal forms the output.

The latch circuit 20 comprises transistors Q1 & Q2 and bias current resistors R4, R5, R6 & R7. The base terminal of Q1 forms the latch input which is driven from the comparator 13 output, while the collector terminal forms the output.

Detector disable transistor Q4, is normally biased into conduction through base current supply resistor R11. Under such conditions the charge source for detector output capacitor C4 is shunted thus disabling the ringing detector. Transistor Q5, in conjunction with capacitor C5 and resistor R11 is used to momentarily remove bias supply to Q4 at each mains half-cycle turn-off transition, thus enabling the ringing detector. This is done to minimize the susceptibility of the detector to surrounding electrical noise as previously described.

Q5 is biased by resistors R13, R14 & R15 when Q7 is not in the conducting state. In the Q7 conduction state diode D6 acts to remove base current supply for Q5.

Over-Voltage Detection Circuit

As described above, an additional function which may be implemented to enhance the function of the circuit is the use of an over-voltage, or voltage spike, detection circuit.

Dimmer operation in reverse phase control mode, when connected to highly inductive loads such as iron core transformer based neon lighting, will result in excessive voltage spiking across dimmer terminals at each mains half-cycle dimmer turn-off transition.

Turning off the switch while there is any appreciable level of current causes a sudden rise in the voltage appearing across the load. As described by the well known relationship $$V = L * dI/dt$$

Where V is the voltage appearing across the inductive load;
L is the magnitude of the inductance of the load; and
dI/dt is the rate of change of the current I through the load over time t as will be understood by the person skilled in the art.

As can be seen, the greater the rate of change in current I through the load, the greater the voltage spike occurring. It follows then that the greater the current at the time of turning off the switch, which causes the current to fall to zero in a very short space of time, the greater the rate of change of current and therefore the greater the voltage spike induced.

The over-voltage detection circuit arrangement functions firstly to safely limit spiking voltage amplitude, then activate a latch circuit after spiking has been detected for a number of successive mains voltage half-cycles (for example, 3-6 half cycles).

Once triggered, the latch output status is used to signal to the dimmer control circuit mechanism that dimming operation should be changed to forward phase, or leading edge, control mode.

With reference again to FIG. 10, diodes D1 & D2, in conjunction with intrinsic inverse diodes associated with Q9 & Q10, form a diode bridge to provide full-wave rectification of dimmer voltage waveform as described above in relation to the ringing detector. The series circuit of varistor MV1 and zener diode Z1 provide the necessary dimmer terminal voltage spiking clamping function.

During clamping events, a voltage is developed across resistor R1 and detector output capacitor C2 is able to be charged via resistor R2 and diode D3. Blocking diode D3 prevents discharge of C2 via R2 and R1 during the relatively long time interval between voltage spiking events.

Filter input resistor R2 provides high frequency "noise" rejection function. Output resistor R3, in conjunction with existing latch circuit input resistor R5 and transistor Q2, are used to form a rudimentary comparator function to determine the required detector output voltage level to trigger the latch.

It will be appreciated that the above has been described with reference to a particular embodiment however, many variations and modifications may be made within the scope of the present invention.

In particular, the circuit may be used as a voltage ringing detector for use in any suitable application. Furthermore, while the invention has been described in the context of a universal dimmer to enable it to automatically detect the type of load that is connected to the dimmer, it will be appreciated that the circuit may be applied to a conventional universal dimmer which will determine its operating mode upon first connection to a load and retain that operating information in memory for its continued use in that mode.

Alternatively, one or more of the circuits described may even be able to be used in a non-universal dimmer as a safety precaution to shut down a trailing edge dimmer that is accidentally connected to an inductive load.

It will also be understood that throughout this specification, unless the context requires otherwise, the words 'comprise' and 'include' and variations such as 'comprising' and 'including' will be understood to imply the inclusion of a stated integer or group of integers but not the exclusion of any other integer or group of integers.

The reference to any prior art in this specification is not, and should not be taken as, an acknowledgement or any form of suggestion that such prior art forms part of the common general knowledge.

The invention claimed is:

1. A circuit for detecting the presence of an inductive load, the circuit comprising:
   a voltage ringing detector for detecting a voltage ringing signal across the inductive load comprising:
      a filter for extracting a voltage ringing signal, wherein the filter filters out a line voltage frequency in a signal across the inductive load;
      a peak detector for detecting peaks in the voltage ringing signal; and
   a signal generator for generating a signal indicating the presence of an inductive load upon the voltage ringing detector detecting said voltage ringing signal.

2. A circuit as claimed in claim 1 further comprising a signal generator to generate a signal to a mode changing circuit for changing a mode of operation of a dimmer circuit from trailing edge to leading edge operation upon detection of the voltage ringing signal.

3. A dimmer circuit comprising the circuit as claimed in claim 1.

4. A dimmer circuit as claimed in claim 3 wherein the dimmer circuit is a trailing edge dimmer circuit.

5. A universal dimmer circuit comprising the circuit as claimed in claim 1.

6. A circuit as claimed in claim 1, wherein the filter is a high pass filter.

7. A circuit as claimed in claim 6 wherein the peak detector detects the ringing amplitude of peaks in the voltage ringing signal and generates a dc signal corresponding to the detected ringing amplitude.

8. A circuit as claimed in claim 7 further comprising a dc accumulator for accumulating the dc signal over time to provide an accumulated dc signal.

9. A circuit as claimed in claim 8 further comprising a comparator for comparing the accumulated dc signal with a reference voltage and producing an output when the accumulated dc signal exceeds the reference voltage.

10. A circuit as claimed in claim 9 further comprising an inductive load indicator for generating a signal indicating the presence of the inductive load when the output of the comparator indicates the accumulated dc signal exceeds the reference voltage.

11. A method for detecting the presence of an inductive load, the method comprising:
    detecting a voltage ringing signal across the load, wherein detecting a voltage ringing signal comprises:
       filtering the signal across the inductive load using a filter to filter out a line voltage frequency and extracting a voltage ringing signal; and
       detecting peaks in the voltage and
    generating a signal indicating the presence of an inductive load upon detecting said voltage ringing signal.

12. A method as claimed in claim 11 wherein the filter is a high pass filter.

13. A method as claimed in claim 12 further comprising detecting the ringing amplitude of peaks in the voltage ringing signal and generating a dc signal corresponding to the detected ringing amplitude.

14. A method as claimed in claim 13 further comprising only detecting the ringing amplitude of the peaks in the voltage signal during a brief period at each half cycle of the voltage signal applied to the load so as to minimize the effect of electrical noise.

15. A method as claimed in claim 13 further comprising accumulating the dc signal over time to provide an accumulated dc signal.

16. A method as claimed in claim 15 further comprising comparing the accumulated dc signal with a reference voltage and generating an output when the accumulated dc signal exceeds the reference voltage.

17. A method as claimed in claim 11 further comprising generating a signal to change a mode of operation of a dimmer circuit from trailing edge to leading edge operation upon detection of the voltage ringing signal.

18. A method as claimed in claim 14 wherein the output is a signal indicating the presence of the inductive load.

19. A voltage ringing detector for detecting a voltage ringing signal across an inductive load, the voltage ringing detector comprising:
    a high pass filter for producing a filtered signal, wherein the high pass filter filters out at least a line voltage frequency in the voltage ringing signal across the inductive load; and
    a peak detector for detecting peaks in the filtered signal and for generating a dc signal corresponding to the detected-ringing amplitude of peaks in the filtered signal.

20. A method of detecting a voltage ringing signal across an inductive load, the method comprising:
    filtering the signal across the inductive load using a high pass filter to filter out a line voltage frequency and to produce a filtered signal;
    detecting peaks in the filtered signal; and
    generating a dc signal corresponding to the ringing amplitude of peaks in the filtered signal.

21. A method of operating a universal dimmer used to control power applied to a load, the method comprising:
    causing the universal dimmer to operate in the trailing edge mode upon activation; and
    detecting the type of load to which the universal dimmer is connected upon each activation of the universal dimmer circuit, the step of detecting the type of load further comprising:
       detecting a voltage ringing signal across the load, wherein detecting a voltage ringing signal comprises:
          filtering the signal across the inductive load using a filter to filter out a line voltage frequency and extracting a voltage ringing signal; and
          detecting peaks in the voltage ringing signal; and
          generating a signal indicating the presence of an inductive load upon detecting said voltage ringing signal; and
    causing the universal dimmer to operate in leading edge mode if an inductive load is detected.

22. A method as claimed in claim 21 wherein the filter is a high pass filter.

23. A method as claimed in claim 22 further comprising detecting the ringing amplitude of peaks in the voltage ringing signal and generating a dc signal corresponding to the detected ringing amplitude.

24. A method as claimed in claim 23 further comprising only detecting the ringing amplitude of the peaks in the voltage ringing signal during a brief period at each half cycle of the voltage signal applied to the load so as to minimize the effect of electrical noise.

25. A method as claimed in claim 23 further comprising accumulating the dc signal over time to provide an accumulated dc signal.

26. A method as claimed in claim 25 further comprising comparing the accumulated dc signal with a reference voltage and generating an output when the accumulated dc signal exceeds the reference voltage.

27. A method as claimed in claim 26 wherein the output is a signal indicating the presence of the inductive load.

* * * * *